(12) United States Patent
Hsu

(10) Patent No.: US 12,062,685 B2
(45) Date of Patent: Aug. 13, 2024

(54) INDUCTOR STRUCTURE HAVING CONDUCTIVE SHEETS HAVING FAN PLATE SHAPE ARRANGED IN RING STRUCTURE AND FABRICATION METHOD THEREOF, ELECTRONIC PACKAGE AND FABRICATION METHOD THEREOF, AND METHOD FOR FABRICATING PACKAGING CARRIER

(71) Applicant: PHOENIX PIONEER TECHNOLOGY CO., LTD., Hsinchu County (TW)

(72) Inventor: Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 245 days.

(21) Appl. No.: 17/586,842

(22) Filed: Jan. 28, 2022

(65) Prior Publication Data
US 2022/0254869 A1    Aug. 11, 2022

(30) Foreign Application Priority Data
Feb. 5, 2021   (TW) .................................. 110104476

(51) Int. Cl.
*H01F 27/28*   (2006.01)
*H01F 27/32*   (2006.01)
(Continued)

(52) U.S. Cl.
CPC .......... *H01L 28/10* (2013.01); *H01F 27/2852* (2013.01); *H01F 27/327* (2013.01); *H01F 41/04* (2013.01); *H01L 23/3128* (2013.01); *H01L 23/49822* (2013.01); *H01L 23/49838* (2013.01); *H01L 23/645* (2013.01); *H01L 24/16* (2013.01);
(Continued)

(58) Field of Classification Search
CPC .... H01F 27/2852; H01F 27/327; H01F 41/04; H01L 23/3128; H01L 23/49822; H01L 23/49838; H01L 23/645; H01L 24/16
See application file for complete search history.

(56) References Cited

U.S. PATENT DOCUMENTS

2008/0265367 A1* 10/2008 Tan ..................... H01L 24/81
                                                    257/E21.511
2017/0110237 A1*  4/2017 Kim ..................... H03F 15/00
(Continued)

*Primary Examiner* — Michael Jung
(74) *Attorney, Agent, or Firm* — Amin, Turocy & Watson, LLP

(57) ABSTRACT

An inductor structure is provided. A plurality of first and second conductive posts have end surfaces corresponding in profile to ends of first conductive sheets, respectively. As such, the profiles of the end surfaces of the first and second conductive posts are non-cylindrical so as to increase the contact area between the first conductive sheets and the first and second conductive posts, thereby improving the conductive quality and performance of the inductor. Further, since the first and second conductive posts are formed by stacking a plurality of post bodies on one another, the number and cross-sectional area of loops are increased so as to increase the inductance value. A method for fabricating the inductor structure, an electronic package and a fabrication method thereof, and a method for fabricating a packaging carrier are further provided.

20 Claims, 12 Drawing Sheets

(51) Int. Cl.
   *H01F 41/04*  (2006.01)
   *H01L 23/00*  (2006.01)
   *H01L 23/31*  (2006.01)
   *H01L 23/498* (2006.01)
   *H01L 23/64*  (2006.01)
   *H01L 49/02*  (2006.01)
   *H01L 27/32*  (2006.01)

(52) U.S. Cl.
   CPC ............... *H01L 2224/16227* (2013.01); *H01L 2924/19042* (2013.01); *H01L 2924/19103* (2013.01)

(56) References Cited

U.S. PATENT DOCUMENTS

| | | | |
|---|---|---|---|
| 2019/0180925 A1* | 6/2019 | Kurobe | H01F 27/29 |
| 2020/0235716 A1* | 7/2020 | Eid | H01L 23/66 |
| 2020/0295121 A1* | 9/2020 | Liao | H01L 23/49838 |

* cited by examiner

INDUCTOR STRUCTURE HAVING CONDUCTIVE SHEETS HAVING FAN PLATE SHAPE ARRANGED IN RING STRUCTURE AND FABRICATION METHOD THEREOF, ELECTRONIC PACKAGE AND FABRICATION METHOD THEREOF, AND METHOD FOR FABRICATING PACKAGING CARRIER

CROSS-REFERENCE TO RELATED APPLICATIONS

This application claims priority to Taiwan Application Serial No. 110104476, filed on Feb. 5, 2021. The entirety of the above-mentioned patent application is hereby incorporated by reference herein and made a part of this specification.

BACKGROUND

1. Technical Field

The present disclosure relates to inductor structures, and more particularly, to using a packaging substrate technique to form a 3D coil type inductor structure embedded in a substrate, an electronic package and a fabrication method thereof, and a method for fabricating a packaging carrier.

2. Description of Related Art

In general semiconductor application devices such as communication or high-frequency semiconductor devices, radio-frequency (RF) passive elements such as resistors, inductors, capacitors and oscillators are electrically connected to packaged semiconductor chips so as to cause the semiconductor chips to have certain electric current characteristics or send signals.

For example, in a system-in-package (SiP) semiconductor device, most passive elements are disposed on a surface of a substrate. However, to prevent the passive elements from adversely affecting the electrical connection and configuration between semiconductor chips and bonding pads of the substrate, the passive elements are generally disposed at corners of the substrate or a region (e.g., the additional layout area of the substrate) outside the semiconductor chip mounting region.

Such a limitation on the position of the passive elements reduces the wiring flexibility of the substrate. Further, the position of the bonding pads limits the number of the passive elements mountable on the substrate, thereby hindering high integration of the semiconductor device. Furthermore, as the high-performance requirement of the semiconductor package causes a great increase in the number of the passive elements, the surface area of the packaging substrate is increased to accommodate both the semiconductor chips and the passive elements. As such, the semiconductor package is increased in volume. Further, the distance between the passive elements such as inductors and the semiconductor chips is relatively large, thus reducing the electrical characteristics and performance of the passive elements.

To overcome the above-described drawbacks, passive elements are fabricated along with substrate circuits. For example, Taiwan Patent No. M580254 describes a coil type inductor to overcome the above-described drawbacks. However, such an inductor is a separate passive element and mounted by using a surface-mount technology (SMT) technique. As such, the conductivity of the circuit path is limited by the wiring design. FIGS. 1A and 1B are schematic partial perspective and upper plan views of the coil type inductor 1 described in Taiwan Patent No. M580254. Referring to FIGS. 1A and 1B, the coil type inductor 1 is formed by arranging a plurality of inductor elements 1a along a ring path. The inductor elements 1a are encapsulated by an insulating body 1b between two stacked substrates (as shown in FIG. 17 of Taiwan Patent No. M580254). Each of the inductor elements 1a is constituted by a plurality of lower conductive sheets 11, a plurality of inner conductive posts 13, a plurality of outer conductive posts 14 and a plurality of upper conductive sheets 12.

Moreover, the plurality of lower conductive sheets 11 have a long taper shape, and the inner conductive posts 13 are disposed on small ends 11a of the lower conductive sheets 11, and the outer conductive posts 14 are disposed on large ends 11b of the lower conductive sheets 11. Each of the upper conductive sheets 12 is connected across adjacent two of the lower conductive sheets 11. That is, the small end 12a of the upper conductive sheet 12 is bonded onto the inner conductive post 13 of one of the lower conductive sheets 11, and the large end 11b is bonded onto the outer conductive post 14 of the other lower conductive sheet 11. As such, the plurality of lower conductive sheets 11 and the plurality of upper conductive sheets 12 are alternately arranged so as to cause the plurality of inductor elements 1a to constitute a spiral-shaped coil inductor 1.

However, in Taiwan Patent No. M580254, substrates made of a semiconductor material are etched to form transverse and longitudinal inductors and then bonded with a solder material so as to form a 3D ring inductor. As such, it has a problem of up and down alignment and needs to leave a large space for alignment, thus limiting the number of turns of the coil. Further, the solder material positioned between the lower conductive sheets 11 and the upper conductive sheets 12 adversely affects the performance of the coil type inductor 1.

Further, in fabrication of the conventional coil type inductor 1, a plurality of circular holes are formed in the insulating body 1b by mechanical drilling/laser drilling for the inner conductive posts 13 (as shown in FIG. 11 of Taiwan Patent No. M580254). Limited by the circular holes, the inner conductive posts 13 have a cylindrical shape. As such, the distance between the inner conductive posts 13 is limited by the drilling process and cannot be reduced, and the inner conductive posts 13 cannot correspond in profile to the small ends 11a of the lower conductive sheets 11. Therefore, the number of winding loops of the coil type inductor 1 is also limited by the diameter of the circular holes and hence the surface area of the coil type inductor 1 cannot be increased due to the limited number of winding loops, thus hindering increase of the inductance.

In addition, in fabrication of the conventional coil type inductor 1, the formation of the circular holes reduces the area of copper in the inner conductive posts 13 for electrical conduction, resulting in a larger resistance of the inner conductive posts 13. Therefore, the inductance efficiency becomes lower and heat is more prone to accumulate, thus adversely affecting the overall performance of end products.

Therefore, how to overcome the above-described drawbacks of the prior art has become an urgent issue in the art.

SUMMARY

In view of the above-described drawbacks of the prior art, the present disclosure provides an inductor structure, which comprises: an insulating body having opposite first and second sides; a plurality of first conductive sheets having a fan plate shape and embedded in the insulating body from the first side of the insulating body, wherein each of the first conductive sheets has opposite first and second ends, and a width of the first end is less than a width of the second end; a plurality of first conductive posts embedded in the insulating body and electrically connected to the first ends of the first conductive sheets, respectively, wherein a profile of an end surface of each of the first conductive posts corresponds to a profile of the first end of the first conductive sheet, and each of the first conductive posts comprises a plurality of first post bodies stacked on one another; a plurality of second conductive posts embedded in the insulating body and electrically connected to the second ends of the first conductive sheets, respectively, wherein a profile of an end surface of each of the second conductive posts corresponds to a profile of the second end of the first conductive sheet, and each of the second conductive posts comprises a plurality of second post bodies stacked on one another; a plurality of second conductive sheets having a curved plate shape and embedded in the insulating body from the second side of the insulating body, wherein each of the second conductive sheets has opposite third and fourth ends and is disposed on and across adjacent two of the first conductive sheets, a profile of the third end of the second conductive sheet corresponds to the profile of the first end of the first conductive sheet, the third end of the second conductive sheet is electrically connected to the first conductive post on the first end of one of the two adjacent first conductive sheets, a profile of the fourth end of the second conductive sheet corresponds to the profile of the second end of the first conductive sheet, and the fourth end of the second conductive sheet is electrically connected to the second conductive post on the second end of the other one of the two adjacent first conductive sheets, and wherein at least portions of adjacent two of the first conductive sheets are exposed from the first side of the insulating body or at least portions of adjacent two of the second conductive sheets are exposed from the second side of the insulating body for bonding with electrode pads. Further, an insulating protective layer can be formed on the insulating body and the electrode pads and has at least an opening exposing portions of the electrode pads.

The present disclosure further provides a method for fabricating an inductor structure using a coreless fabrication technique of an integrated circuit carrier. The method comprises: forming a plurality of first conductive sheets on a carrier via a patterning process, wherein each of the first conductive sheets has opposite first and second ends, a width of the first end is less than a width of the second end, and each of the first conductive sheets has a fan plate shape; forming a first conductive post on the first end of each of the first conductive sheets via the patterning process, and forming a second conductive post on the second end of each of the first conductive sheets via the patterning process, wherein a profile of an end surface of the first conductive post corresponds to a profile of the first end of the first conductive sheet, a profile of an end surface of the second conductive post corresponds to a profile of the second end of the first conductive sheet, the first conductive post comprises a plurality of first post bodies stacked on one another, and the second conductive post comprises a plurality of second post bodies stacked on one another; forming an insulating material on the carrier to encapsulate the plurality of first conductive sheets, the first conductive posts and the second conductive posts, wherein portions of the first conductive posts and portions of the second conductive posts are exposed from the insulating material; forming a plurality of second conductive sheets on the insulating material via a patterning process, wherein each of the second conductive sheets has opposite third and fourth ends and is disposed on and across adjacent two of the first conductive sheets, a profile of the third end of the second conductive sheet corresponds to the profile of the first end of the first conductive sheet, the third end of the second conductive sheet is electrically connected to the first conductive post on the first end of one of the two adjacent first conductive sheets, a profile of the fourth end of the second conductive sheet corresponds to the profile of the second end of the first conductive sheet, and the fourth end of the second conductive sheet is electrically connected to the second conductive post on the second end of the other one of the two adjacent first conductive sheets; forming an insulating layer on the insulating material and the plurality of second conductive sheets to encapsulate the plurality of second conductive sheets; removing the carrier to expose the insulating material and the plurality of first conductive sheets; and forming another insulating layer on the insulating material and the plurality of first conductive sheets to encapsulate the first conductive sheets, wherein the insulating layers and the insulating material form an insulating body having opposite first and second sides, wherein at least portions of adjacent two of the first conductive sheets are exposed from the first side of the insulating body or at least portions of adjacent two of the second conductive sheets are exposed from the second side of the insulating body for bonding with electrode pads.

In the above-described inductor structure and method, the plurality of first conductive sheets are arranged in a ring structure, the first ends of the first conductive sheets form an inner ring boundary of the ring structure, and the second ends of the first conductive sheets form an outer ring boundary of the ring structure relative to the inner ring boundary.

In the above-described inductor structure and method, the first end of each of the first conductive sheets has an arc shape, and the end surface of the first conductive post disposed on the first end of the first conductive sheet has a fingertip shape.

In the above-described inductor structure and method, the first end of each of the first conductive sheets has a taper shape, and the end surface of the first conductive post disposed on the first end of the first conductive sheet has a triangular shape.

In the above-described inductor structure and method, further comprising a connecting pad formed between the first post bodies and/or the second post bodies.

In the above-described inductor structure and method, widths of the plurality of first post bodies are different and/or widths of the plurality of second post bodies are different.

In the above-described inductor structure and method, the insulating body comprises a magnetic conducting material. For example, the insulating body comprises multi-layers of insulating material and at least one layer of the insulating material is the magnetic conducting material, and a dielectric material is formed on the magnetic conducting material for a circuit electroplating process.

The above-described inductor structure and method further comprises patterned electroplating at least one magnetic conducting metal in the insulating body, and the magnetic conducting metal comprises nickel, zinc, manganese, iron, cobalt, or a combination thereof. For example, the magnetic conducting metal is disposed around the first conductive post on the first end and the second conductive post on the third end to allow the first conductive post on the first end and the second conductive post on the third end to be positioned within a ring of the magnetic conducting metal. Alternatively, the magnetic conducting metal is distributed in at least a layer, at least a fine dot, at least a fine block, or at least a fine strip.

In the above-described inductor structure and method, the conductive posts and the insulating material are fabricated in a layerwise build-up manner or in a single build-up manner by using the coreless fabrication technique of the integrated circuit carrier.

The present disclosure further provides an electronic package, which comprises: a packaging carrier having a circuit structure; the inductor structure as described above formed in the packaging carrier and electrically connected to the circuit structure; and at least one electronic element disposed on one side of the packaging carrier and electrically connected to the circuit structure and the inductor structure.

The above-described electronic package further comprises an encapsulant encapsulating the electronic element.

The present disclosure further provides a method for fabricating a packaging carrier, which comprises concurrently fabricating a circuit structure and at least the inductor structure as described above.

The present disclosure further provides a method for fabricating an electronic package, which comprises: providing a packaging carrier having a circuit structure; forming the inductor structure as described above in the packaging carrier; and disposing at least one electronic element on one side of the packaging carrier, wherein the electronic element is electrically connected to the circuit structure and the inductor structure.

According to the present disclosure, the end surfaces of the first conductive posts having a multi-layer post body stack correspond in profile to the first ends of the first conductive sheets, and the end surfaces of the second conductive posts having a multi-layer post body stack correspond in profile to the second ends of the first conductive sheets. Therefore, compared with the prior art, the present disclosure increases the contact area between the first conductive sheets and the first and second conductive posts so as to effectively reduce the resistance value of the inductor structure. Further, the present disclosure increases the number and cross-sectional area of loops so as to increase the inductance value as well as the quality factor of the inductor structure.

BRIEF DESCRIPTION OF THE DRAWINGS

FIG. 2-2 is a schematic plan view showing another aspect of FIG. 2-1.

FIG. 2-3 is a schematic partial plan view of the inductor structure according to the present disclosure.

FIG. 2-4 is a schematic partial plan view showing another aspect of FIG. 2-3.

FIG. 3A-1 is a schematic cross-sectional view of the inductor structure according to the present disclosure.

FIG. 3A-2 is a schematic cross-sectional view showing another aspect of FIG. 3A-1.

FIG. 3B-1 is a schematic cross-sectional view showing another aspect of FIG. 3A-1.

FIG. 3B-2 is a schematic cross-sectional view showing another aspect of FIG. 3B-1.

FIG. 4A to FIG. 4F-1 are schematic cross-sectional views illustrating a method for fabricating the inductor structure according to the present disclosure.

FIG. 4F-2 is a schematic cross-sectional view illustrating a method for fabricating the inductor structure according to another embodiment of the present disclosure.

FIG. 5A-1 is a schematic cross-sectional view of an electronic package according to the present disclosure.

FIG. 5A-2 is a schematic cross-sectional view showing another aspect of FIG. 5A-1.

FIG. 5B-1 is a schematic cross-sectional view showing another aspect of FIG. 5A-1.

FIG. 5B-2 is a schematic cross-sectional view showing another aspect of FIG. 5B-1.

FIG. 6A-1 is a schematic cross-sectional view showing an inductor structure according to another embodiment of the present disclosure.

FIG. 6A-2 is a schematic cross-sectional view showing another aspect of FIG. 6A-1.

FIG. 6B-1 is a schematic cross-sectional view showing another aspect of FIG. 6A-1.

FIG. 6B-2 is a schematic cross-sectional view showing another aspect of FIG. 6B-1.

DETAILED DESCRIPTION OF THE EMBODIMENTS

Figure 1A:
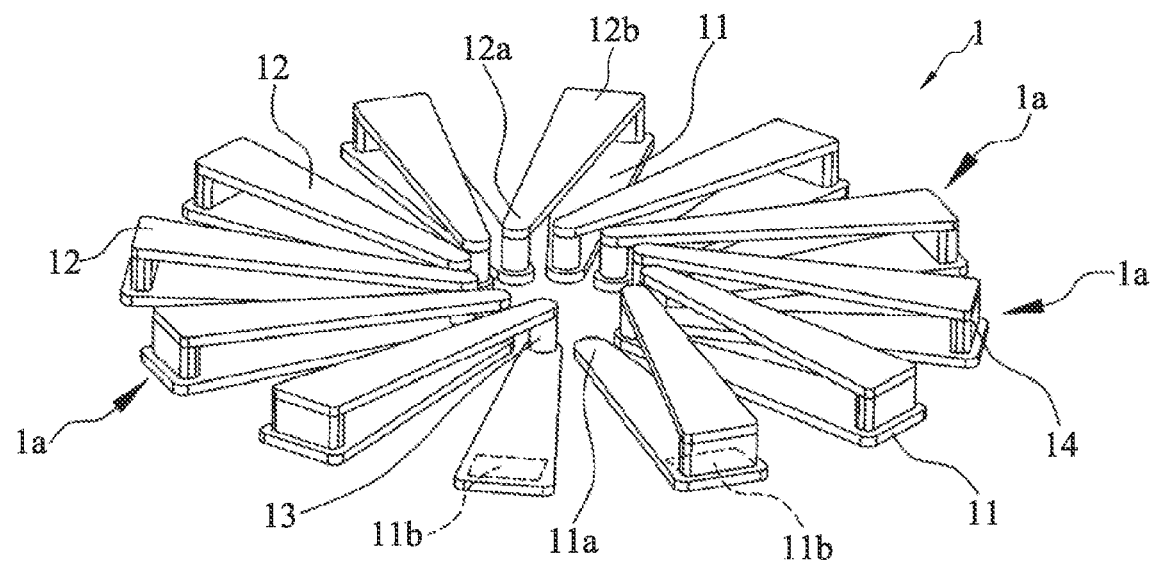
FIG. 1A is a schematic partial perspective view of a conventional inductor.
Figure 1B:
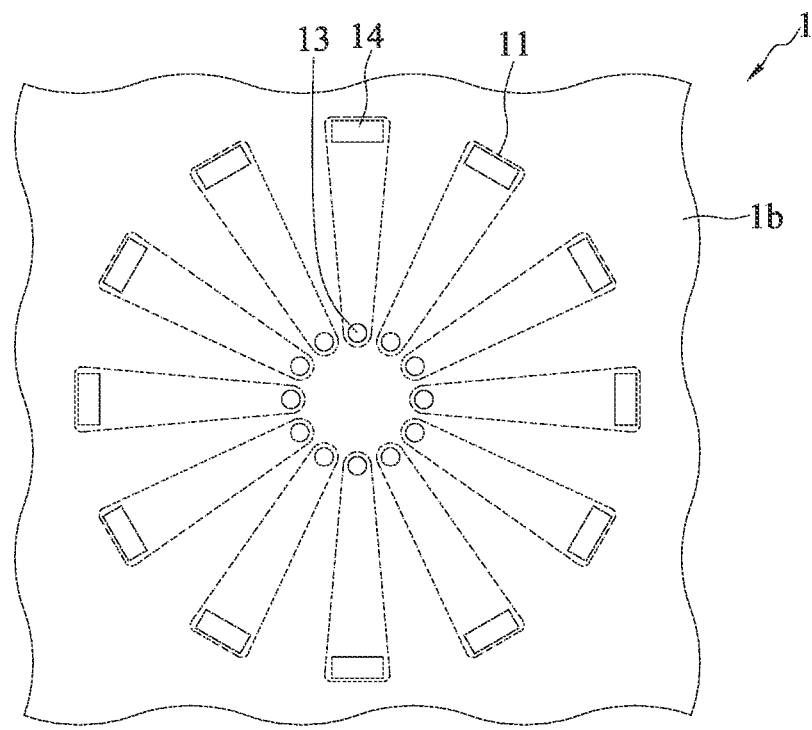
FIG. 1B is a schematic partial upper plan view of the conventional inductor.

The following illustrative embodiments are provided to illustrate the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first," "second," "on," "a," etc., are merely for illustrative purposes and should not be construed to limit the scope of the present disclosure.

FIGS. 2-1, 2-3, 3A-1 are schematic views of an inductor structure 2 according to the present disclosure. Referring to FIGS. 2-1, 2-3 and 3A-1, the inductor structure 2 has an insulating body 2b and an inductor body 2a bonded to the insulating body 2b. The inductor body 2a has a plurality of first conductive sheets 21, a plurality of first conductive posts 23, a plurality of second conductive posts 24 and a plurality of second conductive sheets 22.

Figures 1, 2:
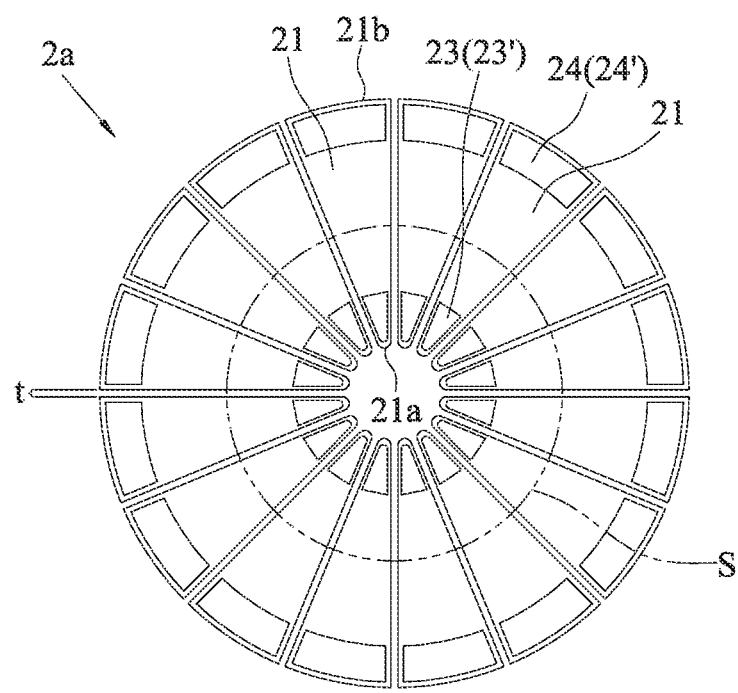
FIG. 2-1 is a schematic plan view of first conductive sheets of an inductor structure according to the present disclosure.
Figure 2:
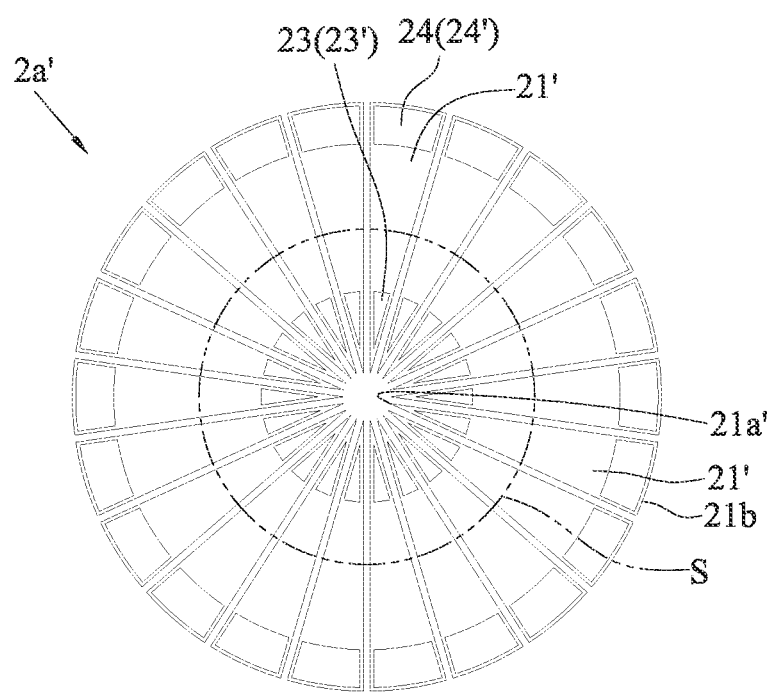
Figures 2, 3:
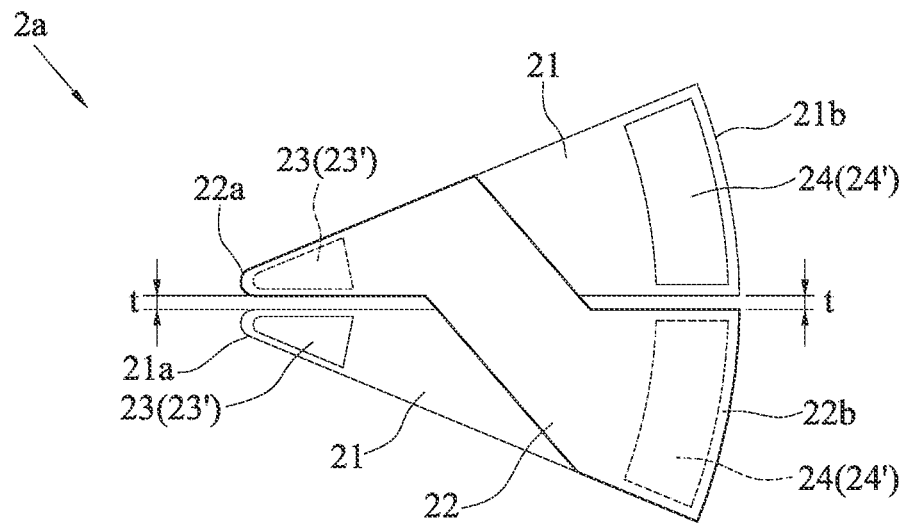
Figures 1, 3A:
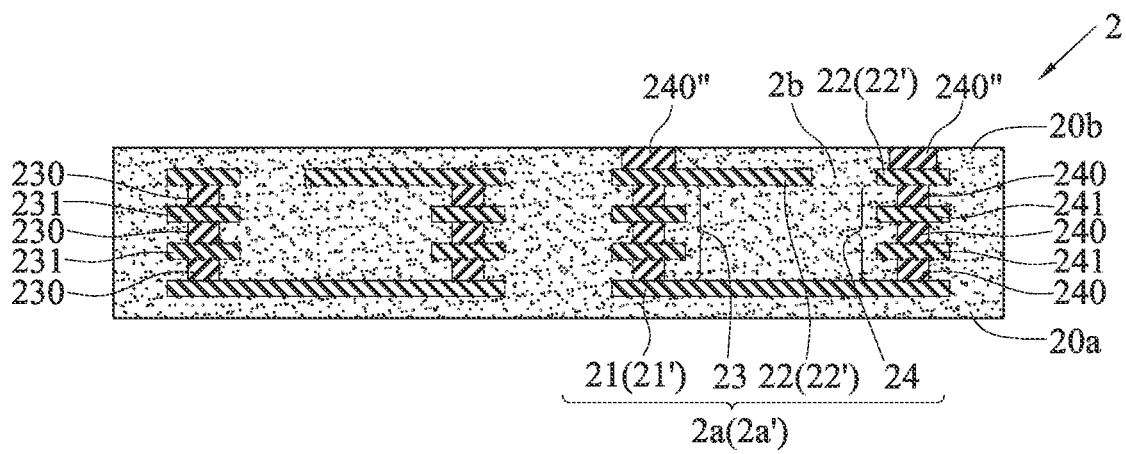
Figures 2, 3A:
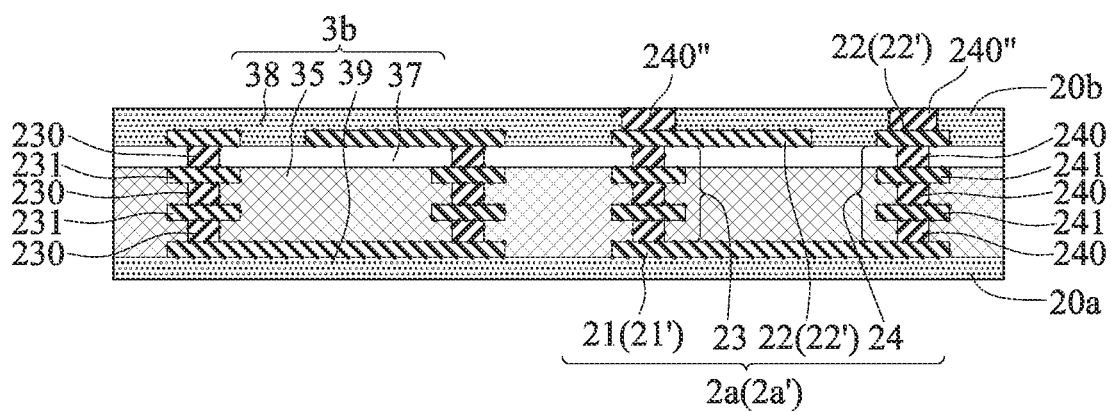

In an embodiment, FIG. 2-1 is a plan view from a lower view angle of FIG. 3A-1, and FIG. 2-3 is a plan view from an upper view angle of FIG. 3A-1.

The insulating body 2b has a first side 20a and a second side 20b opposite to the first side 20a. In an embodiment, the insulating body 2b is fabricated in a coreless build-up manner and therefore has a plurality of insulating layers (as shown in FIG. 4F-1).

Referring to FIG. 3A-1, the first conductive sheets 21 are embedded in the first side 20a of the insulating body 2b. Each of the first conductive sheets 21 has a first end 21a and a second end 21b opposite to the first end 21a (as shown in FIG. 2-1), and the width of the first end 21a is less than the width of the second end 21b. Therefore, the first conductive sheets 21 have a fan plate shape, and the gap t between adjacent first conductive sheets 21 is preferred to be minimized.

In an embodiment, referring to FIG. 2-1, the plurality of first conductive sheets 21 are arranged in a ring structure, the first ends 21a of the plurality of first conductive sheets 21 form an inner ring boundary of the ring structure, and the second ends 21b of the plurality of first conductive sheets 21 form an outer ring boundary of the ring structure relative to the inner ring boundary.

The first conductive posts 23 are embedded in the insulating body 2b and electrically connected to the first ends 21a of the first conductive sheets 21, respectively. Referring to FIG. 2-1, each of the first conductive posts 23 has an end surface corresponding in profile to the first end 21a of the first conductive sheet 21 and is non-cylindrical.

The second conductive posts 24 are embedded in the insulating body 2b and electrically connected to the second ends 21b of the first conductive sheets 21, respectively. Referring to FIG. 2-1, each of the second conductive posts 24 has an end surface corresponding in profile to the second end 21b of the first conductive sheet 21 and is non-cylindrical.

Referring to FIG. 3A-1, the second conductive sheets 22 are embedded in the second side of the insulating body 2b. Referring to FIG. 2-3, each of the second conductive sheets 22 has opposite third end 22a and fourth end 22b and is disposed on and across adjacent two of the first conductive sheets 21. The third end 22a of the second conductive sheet 22 is electrically connected to the first conductive post 23 on the first end 21a of one of the two adjacent first conductive sheets 21 and corresponds in profile to the first end 21a, and the fourth end 22b of the second conductive sheet 22 is electrically connected to the second conductive post 24 on the second end 21b of the other first conductive sheet 21 and corresponds in profile to the second end 21b.

Preferably, the second conductive sheet 22 has a curved plate shape. As such, when the second conductive sheet 22 is disposed on and across the two adjacent first conductive sheets 21, as shown in FIG. 2-3, the third end 22a of the second conductive sheet 22 can completely cover the first conductive post 23 on the first end 21a of the first conductive sheet 21, and the fourth end 22b of the second conductive sheet 22 can completely cover the second conductive post 24 on the second end 21b of the first conductive sheet 21, thus improving the electrical conduction efficiency and reducing the impedance of the inductor body 2a.

Further, according to the fabrication process of the insulating body 2b, each of the first conductive posts 23 can comprise a plurality of (such as three in FIG. 3A-1) first post bodies 230 stacked on one another, and each of the second conductive posts 24 can comprise a plurality of (such as three in FIG. 3A-1) second post bodies 240 stacked on one another. For example, referring to FIG. 3A-1, at least one connecting pad 231, 241 can be formed at a junction of upper and lower post bodies, i.e., between the plurality of first post bodies 230 and/or the plurality of second post bodies 240. Alternatively, in an inductor structure 2' of FIG. 3B-1, the post bodies can be different in width. That is, the plurality of first post bodies 230, 230' are different in width and/or the plurality of second post bodies 240, 240' are different in width (e.g., the width of the first post body 230' in the middle is less than the width of the upper and lower first post bodies 230 and/or the width of the second post body 240' in the middle is less than the width of the upper and lower second post bodies 240) so as to allow the first conductive post 23' and the second conductive post 24' to have a concave-convex peripheral shape. Therefore, through the design of the stacked post bodies, the surface areas of the first conductive posts 23, 23' and the second conductive posts 24, 24' are increased so as to effectively increase the cross-sectional area of loops and thereby increase the inductance value of the inductor structure 2, 2'.

Further, referring to FIG. 3A-1, a plurality of electrode pads 240" are formed on the outermost two adjacent second conductive sheets 22, such that the plurality of electrode pads 240" are embedded in the insulating body 2b and exposed from the second side 20b of the insulating body 2b. The electrode pads 240" are electrically connected to the two second conductive sheets 22. Further, referring to FIG. 6B-1, an insulating protective layer 61 can be formed on the insulating body 2b and the electrode pads 240" according to needs and have a plurality of openings 610 exposing the electrode pads 240". In another aspect, referring to FIGS. 3B-1 and 4F-1, a plurality of openings 201 can be formed on the second side 20b of the insulating body 2b and at least portions of the two adjacent second conductive sheets 22 are exposed from the openings 201 so as to be used as contacts or for bonding with the electrode pads 240".

In addition, referring to FIGS. 2-1 and 2-3, the first end 21a of each of the first conductive sheets 21 and the third end 22a of each of the second conductive sheets 22 have an arc shape, and the end surfaces of the first conductive posts 23, 23' disposed thereon have a fingertip shape, which increases the cross-sectional area of the first conductive posts 23, 23' and hence improves the electrical conduction efficiency, reduces the impedance and increases the thermal conductivity of the inductor structure 2, 2'.

Figures 2, 3, 4:
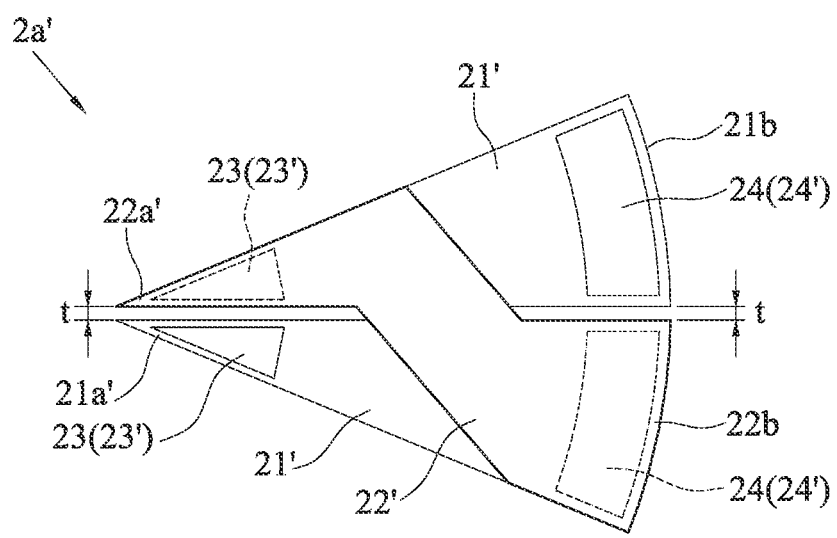

Alternatively, referring to FIGS. 2-2 and 2-4, the first end 21a' of each of the first conductive sheets 21' and the third end 22a' of each of the second conductive sheets 22' have a taper shape, and the end surfaces of the first conductive posts 23, 23' disposed thereon have a triangular shape, which increases the cross-sectional area of the first conductive posts 23, 23' and hence improves the electrical conduction efficiency, reduces the impedance and increases the thermal conductivity of the inductor structure 2, 2'. In addition, the gap t between adjacent first conductive sheets 21' can be effectively reduced so as to increase the number of loops of the inductor body 2a' (for example, 22 loops in FIG. 2-2) and hence effectively improve the inductance value.

Figures 1, 3B:
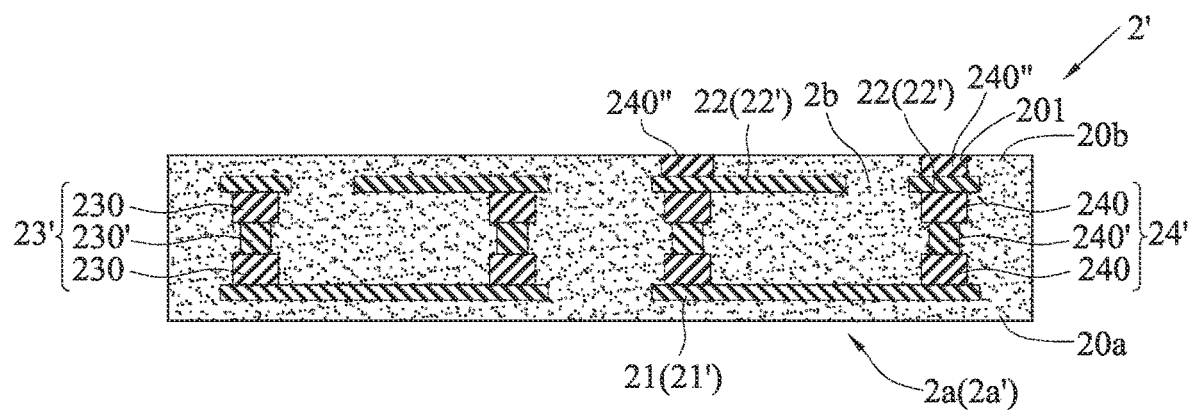
Figures 2, 3B:
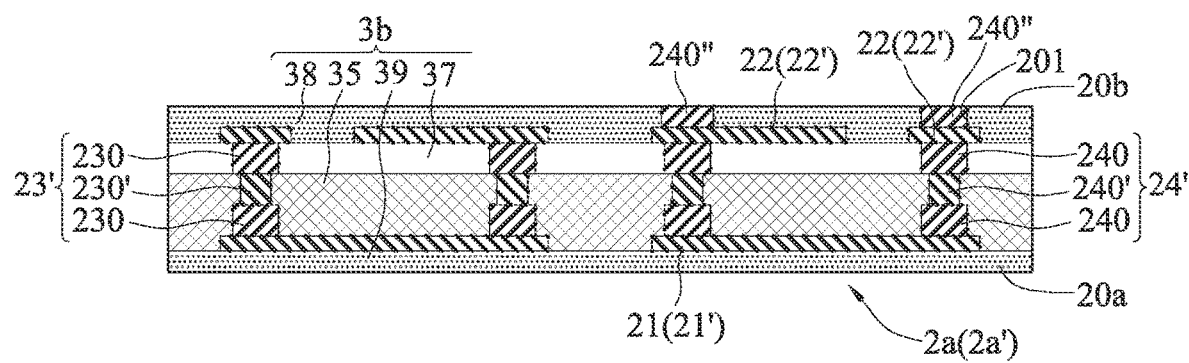

Further, a magnetic conducting material such as iron-nickel-molybdenum (Fe—Ni—Mo) alloy powder, iron-silicon-aluminum (Fe—Si—Al) alloy powder or iron-nickel (Fe—Ni) alloy powder in combination with a resin material can be added into the insulating body 2b. Referring to FIGS. 3A-2 and 3B-2, a magnetic conducting material is added to the insulating material 35 of the insulating body 3b so as to increase the inductance value. Furthermore, if a wiring layer is formed on the magnetic conducting material by patterned electroplating, its reliability verification is not stable and delamination easily occurs. Therefore, a dielectric material (e.g., an insulating material 37) such as Ajinomoto build-up film (ABF), FR5 or polyimide (PI) can be formed on the insulating material 35 for fabricating circuits (e.g., the first post bodies 230 and the second post bodies 240) and thus increasing the number of coil winding loops.

Therefore, according to the inductor body 2a, 2a' of the inductor structure 2, 2' of the present disclosure, since the end surface of each of the first conductive posts 23, 23' corresponds in profile to the first end 21a, 21a' and the third end 22a, 22a' and is non-cylindrical, compared with 12 loops in the prior art, the present disclosure can greatly increase the number of ring-shaped winding loops of the inductor structure 2, 2' according to needs (16 loops in FIGS. 2-1 and 22 loops in FIG. 2-2). Further, since the first conductive posts 23, 23' and the second conductive posts 24, 24' are formed by stacking a plurality of post bodies on one another, the cross-sectional area of loops can be effectively increased so as to improve the inductance value.

Furthermore, according to the inductor body 2a, 2a' of the inductor structure 2, 2' of the present disclosure, the first conductive posts 23, 23' and the second conductive posts 24, 24' can have various non-cylindrical shapes according to needs. Therefore, compared with the prior art, the area of copper in the first conductive posts 23, 23' and the second conductive posts 24, 24' for electrical conduction is greatly increased and hence the resistance of the first conductive posts 23, 23' and the second conductive posts 24, 24' becomes smaller, thus improving the electrical conduction efficiency, enhancing the thermal conductivity and improving the overall performance of end products.

FIG. 4A to FIG. 4F-1 are schematic cross-sectional views illustrating a method for fabricating the inductor structure 2 according to the present disclosure. Through the fabrication method, the inductor structure 2 is formed with a plurality of first conductive posts 23 and a plurality of second conductive posts 24 of at least two layers (e.g., three layers in FIG. 4F-1).

In an embodiment, the inductor structure 2 is fabricated via a circuit structure fabrication method using an integrated circuit (IC) carrier, e.g., a patterned build-up circuit fabrication method.

Figure 4A:
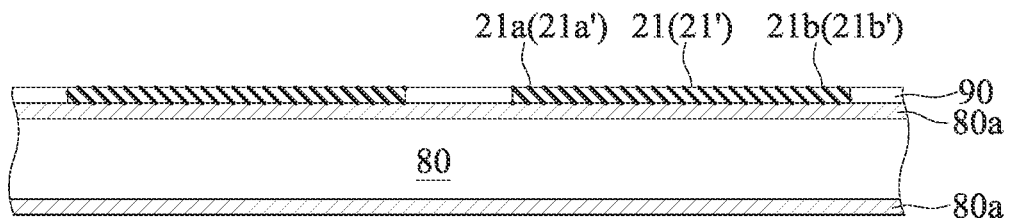
Figure 4B:
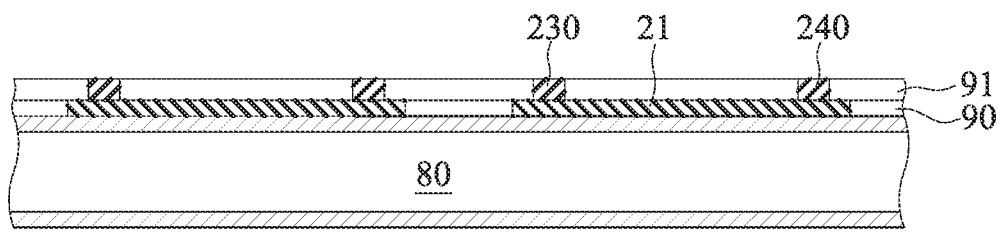

Referring to FIG. 4A, a resistance layer 90 such as a dry film is formed on a carrier 80, and a plurality of first conductive sheets 21, 21' are formed in the resistance layer 90 on the carrier 80 via a patterning process.

In an embodiment, the carrier 80 is, but not limited to, a base material such as a composite base material of an insulating material and a metal material (e.g., stainless steel, copper, copper alloy, aluminum alloy or a combination thereof). In an embodiment, the carrier 80 is a composite base material with a separable copper-containing metal material 80a on both sides thereof.

Further, referring to FIG. 2-1 or FIG. 2-2, the plurality of first conductive sheets 21, 21' are spacingly arranged along a circular path S in a ring structure. The first ends 21a, 21a' of the plurality of first conductive sheets 21, 21' form an inner ring boundary of the ring structure and the second ends 21b, 21b' of the plurality of first conductive sheets 21, 21' form an outer ring boundary of the ring structure. It should be understood that the shape of the first conductive sheets 21, 21' is not limited to the fan plate shape of FIG. 2-1 or FIG. 2-2. Instead, the shape of the first conductive sheets 21, 21' can be varied as long as the ends thereof have a reduced size toward the center of the circular path S.

Referring to 4B, another resistance layer 91 such as a dry film is formed on the resistance layer 90 and the plurality of first conductive sheets 21, 21', and then through a patterning process, a plurality of first post bodies 230 and a plurality of second post bodies 240 of a first layer are formed by electroplating on the plurality of first conductive sheets 21, 21' in the resistance layer 91.

In an embodiment, the first post bodies 230 of the first layer are formed on the first ends 21a, 21a' of the first conductive sheets 21, 21', respectively, and the second post bodies 240 are formed on the second ends 21b, 21b' of the first conductive sheets 21, 21', respectively. For example, the end surfaces of the first post bodies 230 correspond in profile to the first ends 21a, 21a' of the first conductive sheets 21, 21', and the end surfaces of the second post bodies 240 correspond in profile to the second ends 21b, 21b' of the first conductive sheets 21, 21'.

Figure 4C:
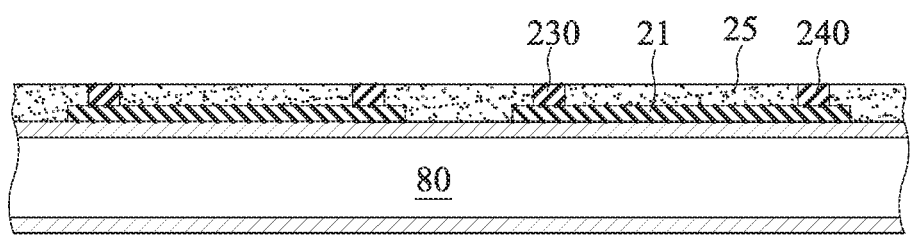

Referring to FIG. 4C, the resistance layers 90, 91 are removed, and then an insulating material 25 is formed on the carrier 80 to encapsulate the plurality of first conductive sheets 21, 21', the first post bodies 230 and the second post bodies 240 and expose one end surfaces of the first post bodies 230 and the second post bodies 240.

Figure 4D:
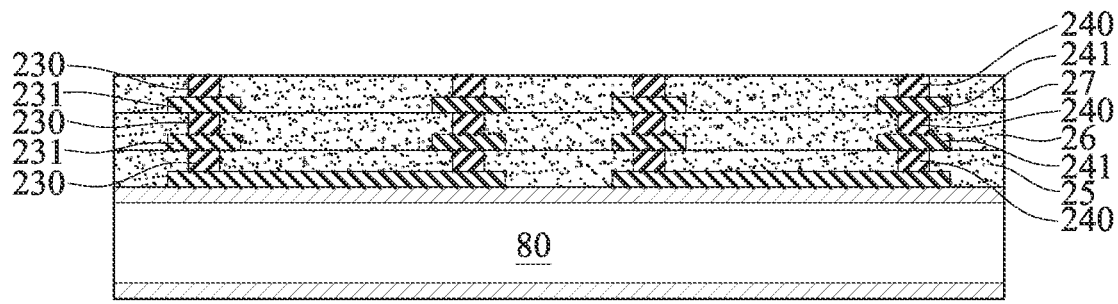

Referring to FIG. 4D, a resistance layer such as a dry film (not shown) is formed on the insulating material 25 according to needs, and through a patterning process, a plurality of connecting pads 231, 241 are formed by electroplating in the resistance layer for bonding with the end surfaces of the first post bodies 230 and the second post bodies 240 of the first layer. Further, portions of surfaces of the connecting pads 231, 241 are exposed from the resistance layer. Thereafter, another resistance layer such as a dry film (not shown) is formed on the resistance layer, and through a patterning process, a plurality of first post bodies 230 and second post bodies 240 of a second layer are formed by electroplating in the resistance layer and bonded with the connecting pads 231, 241.

Thereafter, the resistance layers are removed, and another insulating material 26 is formed on the insulating material 25 to encapsulate the plurality of connecting pads 231, 241 and the first post bodies 230 and the second post bodies 240 of the second layer. Further, one end surfaces of the first post bodies 230 and the second post bodies 240 of the second layer are exposed from the insulating material 26.

Therefore, the above patterning process can be repeated as required so as to fabricate another layer of a plurality of connecting pads 231, 241 and a plurality of first post bodies 230 and a plurality of second post bodies 240 of a third layer, and an insulating material 27 is formed to encapsulate the connecting pads 231, 241 and the first post bodies 230 and the second post bodies 240 of the third layer.

After the outermost first and second post bodies 230, 240 are formed, the first post bodies 230 and the connecting pads 231 are stacked on one another to form the first conductive posts 23, and the second post bodies 240 and the connecting pads 241 are stacked on one another to form the second conductive posts 24.

Figure 4E:
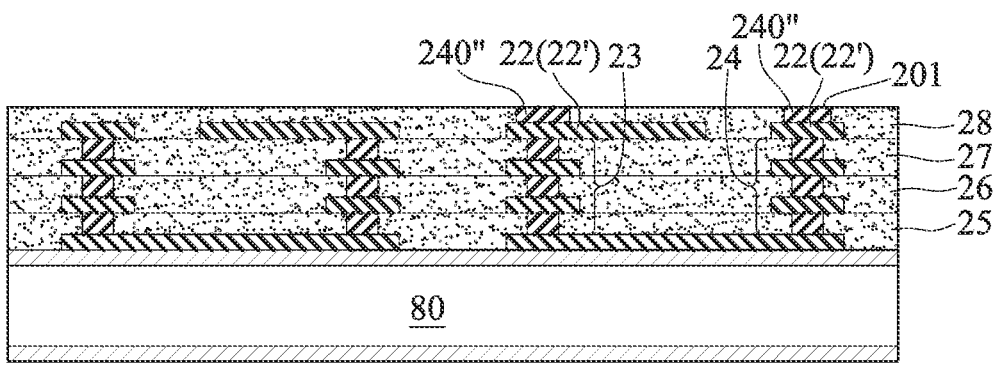
Figures 1, 4F:
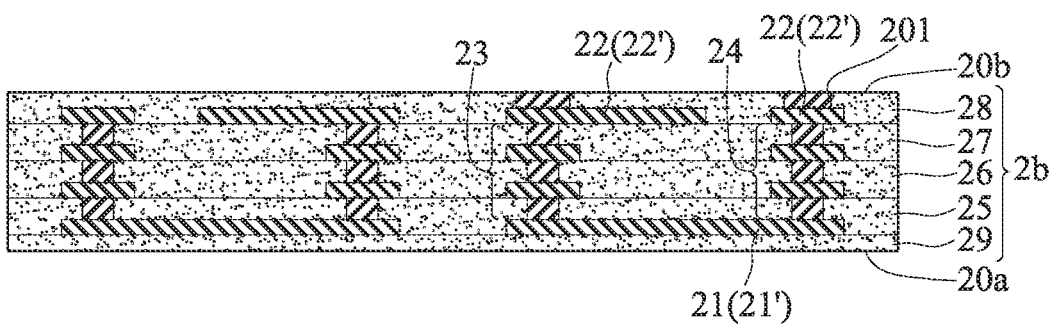
Figures 2, 4F:
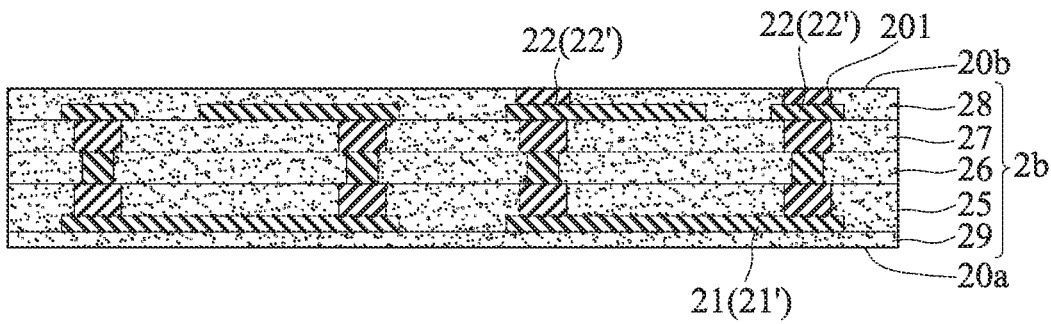

Referring to FIG. 4E, a resistance layer such as a dry film (not shown) is formed on the outermost insulating material (in an embodiment, the insulating material 27 of the third layer), and through a patterning process, a plurality of second conductive sheets 22, 22' are formed in the resistance layer and bonded to the end surfaces of the first conductive posts 23 and the end surfaces of the second conductive posts 24.

In an embodiment, each of the second conductive sheets 22, 22' has a third end 22a, 22a' and a fourth end 22b opposite to the third end 22a, 22a' and is disposed on and across adjacent two of the first conductive sheets 21, 21'. As such, the third end 22a, 22a' of the second conductive sheet 22, 22' is connected to the first conductive post 23 of one of the first conductive sheets 21, 21' and the fourth end 22b of the second conductive sheet 22 is connected to the second conductive post 24 of the other first conductive sheets 21, 21'. For example, the third end 22a, 22a' of the second conductive sheet 22, 22' corresponds in profile to the first end 21a, 21a' of the first conductive sheet 21, 21' (as shown in FIG. 2-3 or FIG. 2-4), and the fourth end 22b of the second conductive sheet 22, 22' corresponds in profile to the second end 21b, 21b' of the first conductive sheet 21, 21' (as shown in FIG. 2-3 or FIG. 2-4).

After the resistance layer is removed, an insulating layer 28 is formed on the outermost insulating material 27 and the plurality of second conductive sheets 22, 22' so as to encapsulate the plurality of second conductive sheets 22, 22'.

Referring to FIG. 4F-1, the carrier 80 is removed to expose the insulating material 25 and the plurality of first conductive sheets 21, 21'. Then, another insulating layer 29 is formed on the insulating material 25 and the plurality of first conductive sheets 21, 21' so as to encapsulate the plurality of first conductive sheets 21, 21'. The insulating layers 28, 29 and the insulating materials 25, 26, 27 constitute an insulating body 2b having a first side 20a (the lower insulating layer 29) and a second side 20b (the upper insulating layer 28) opposite to the first side 20a.

In an embodiment, the upper insulating layer 28 has a plurality of openings 201 and at least portions of adjacent two of the second conductive sheets 22, 22' are exposed for bonding with the electrode pads 240" (as shown in FIGS. 3A-1 and 3B-1).

Further, referring to FIG. 4F-2, in another aspect, the first conductive posts 23' and the second conductive posts 24' can be fabricated by using a patterned build-up circuit fabrication method. The connecting pads 231, 241 are omitted, and a multi-layer (e.g., three-layer) stacked stepped post structure is formed by electroplating. For example, the first posts bodes 230 are different in width and/or the second post bodies 240 are different in width.

In an embodiment, the first end 21a of each of the first conductive sheets 21 and the third end 22a of each of the second conductive sheets 22 have an arc shape, and the end surface of each of the first conductive posts 23, 23' formed thereon by electroplating have a fingertip shape (as shown in FIGS. 2-1 and 2-3). Alternatively, the first end 21a' of each of the first conductive sheets 21' and the third end 22a' of each of the second conductive sheets 22' have a taper shape, and the end surface of each of the first conductive posts 23, 23' formed thereon by electroplating have a triangular shape (as shown in FIGS. 2-2 and 2-4).

Further, the insulating layers 28, 29 and the insulating materials 25, 26, 27 are formed by molding, coating or lamination, and can be a dielectric material. The dielectric material can be, but not limited to, a non-photosensitive dielectric material such as bismaleimide triazine (BT), F5, ABF (with or without glass fiber) and epoxy molding compound (EMC), or a photosensitive dielectric material such as a solder mask material and polyimide (PI).

Furthermore, the insulating materials 25, 26, 27 used for encapsulating the first and second conductive posts 23, 23', 24, 24' can be, but not limited to, a magnetic conducting material such as Fe—Ni—Mo alloy powder, Fe—Si—Al alloy powder or Fe—Ni alloy powder in combination with a resin material. The insulating layers 28, 29 and the insulating materials 25, 26, 27 can be made of different materials according to needs. For example, in the insulating body 3b of FIGS. 3A-2 and 3B-2, the insulating material 35 (and/or the insulating layers 38, 39) is a magnetic conducting material, or the insulating layers 38, 39 can be a solder mask material that is used as an insulating protective layer, and a dielectric material 37 (such as ABF, BT, FR5, PI, etc.) can be formed between one side of the insulating material 35 and the insulating layer 38 and used for a circuit electroplating process.

Therefore, compared with the prior art that forms circular holes by mechanical drilling/laser drilling for conductive posts, the method of the present disclosure defines the shape and position of the first conductive posts 23, 23' and the second conductive posts 24, 24' via a resistance layer such as dry film. As such, the distance between the first conductive posts 23, 23' and the second conductive posts 24, 24' can be minimized and the first conductive posts 23, 23' and second conductive posts 24, 24' can have various non-cylindrical shapes according to needs, thus increasing the conduction area, reducing the impedance, improving the thermal conductivity, and ensuring the overall performance of end inductor products.

Further, since the first conductive posts 23, 23' and the second conductive posts 24, 24' formed by stacking multi-layers of post bodies effectively have an increased height and surface area, the cross-sectional area of the loops of the inductor structure 2, 2' and the number of loops of the inductor structure 2, 2' are effectively increased, thereby greatly improving the inductance value of the inductor structure 2, 2'.

Furthermore, the design of alternate stacking of a magnetic conducting material (at least one of the insulating material 35 and the insulating layers 38, 39) and a non-magnetic conducting material improves the inductance value of the inductor structure 2, 2' and facilitates the conductive circuit process. Therein, if the insulating layers 38, 39 are magnetic conducting materials, the insulating layers 38, 39 can provide a shielding function. It should be understood that any one or more layers of the insulating body 3b can be made of a magnetic conducting material according to needs, and there is no special limitation thereon.

Figures 1, 5A:
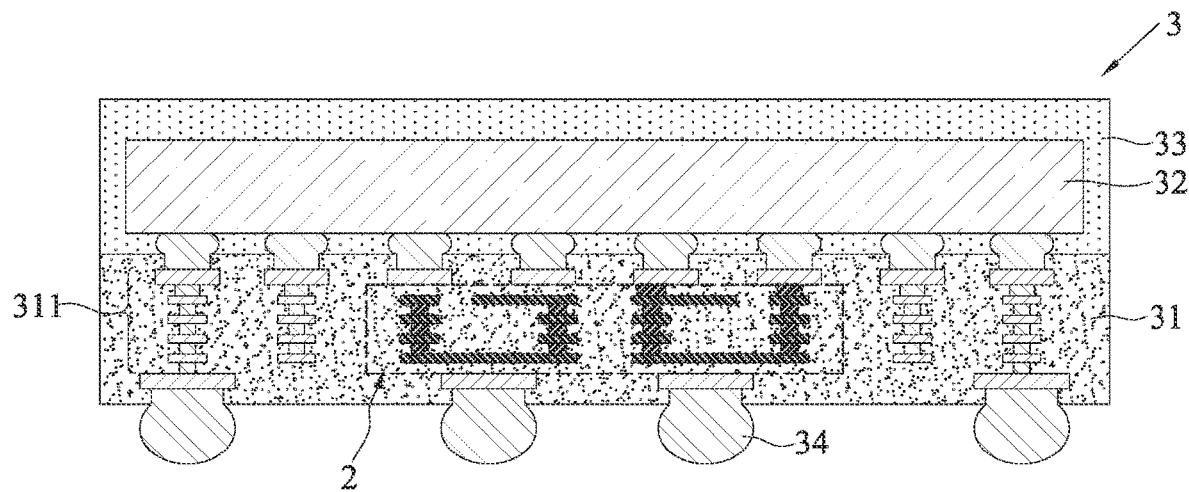
Figures 2, 5A:
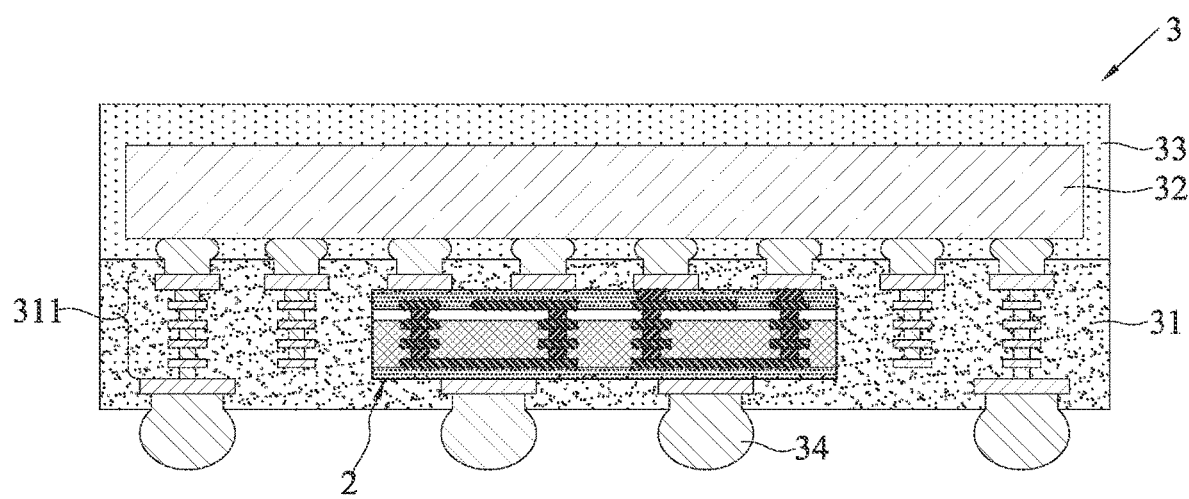
Figures 1, 5B:
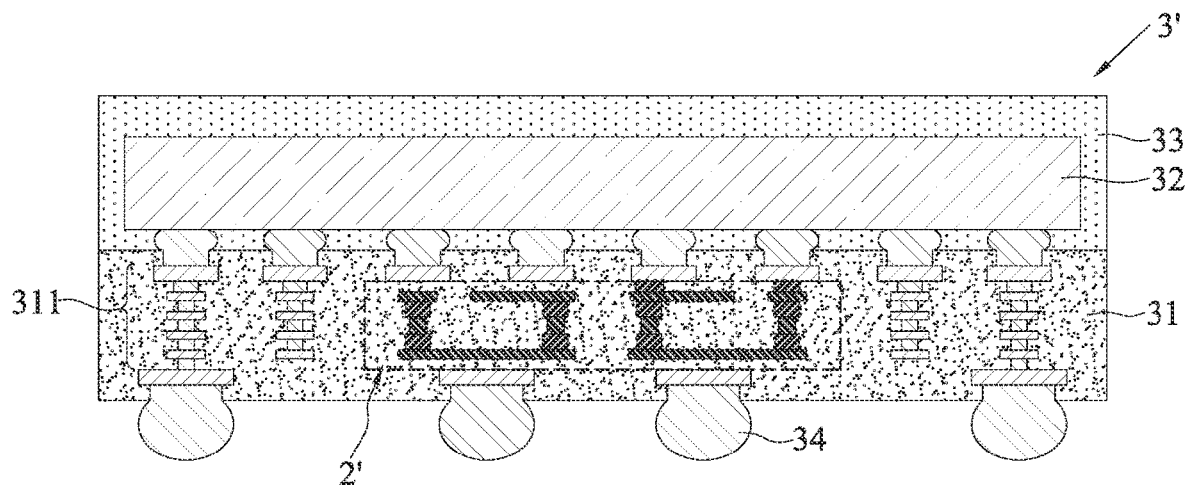
Figures 2, 5B:
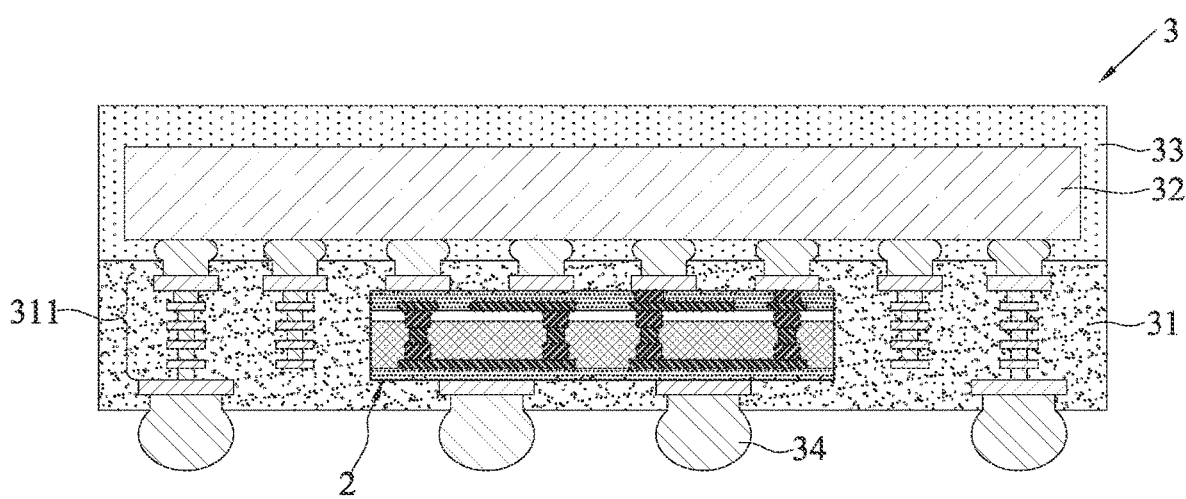

Further, FIG. 5A-1 (and FIG. 5A-2) and FIG. 5B-1 (and FIG. 5B-2) are schematic views of electronic packages 3, 3' according to the present disclosure. Referring to FIG. 5A-1 (and FIG. 5A-2) and FIG. 5B-1 (and FIG. 5B-2), the inductor structure 2, 2' of the present disclosure can be embedded in a packaging carrier 31 having a circuit structure 311 and electrically connected to the circuit structure 311. Then, an electronic element 32 is disposed on the packaging carrier 31, and selectively encapsulated with an encapsulant 33 (e.g., the packaging carrier 31 is packaged with the at least one electronic element 32).

In an embodiment, referring to FIG. 5A-1, the inductor structure 2 and the circuit structure 311 of the packaging carrier 31 are formed concurrently. Alternatively, referring to FIG. 5A-2, FIG. 5B-1 or FIG. 5B-2, the inductor structure 2' is fabricated first and then embedded in the packaging carrier 31 in a component mode.

In an embodiment, the packaging carrier 31 is of a coreless type.

In an embodiment, the electronic element 32 is disposed on an upper side of the packaging carrier 31, and portions of the circuit structure 311 are exposed from a lower side of the packaging carrier 31 for bonding with a plurality of solder balls 34. As such, the electronic package 3, 3' can be mounted onto a circuit board (not shown) via the solder balls 34.

In an embodiment, the electronic element 32 is an active element such as a semiconductor chip, a passive element such as a resistor, a capacitor or an inductor, or a combination thereof. For example, the electronic element 32 is a semiconductor chip, which is flip-chip disposed on the packaging carrier 31 and electrically connected to the circuit structure 311 via a plurality of conductive bumps made of such as a solder material. Alternatively, the electronic element 32 is electrically connected to the circuit structure 311 via a plurality of bonding wires (not shown). It should be understood that the methods for electrically connecting the electronic element 32 and the circuit structure 311 can be varied and not limited to the above.

Figures 1, 6A:
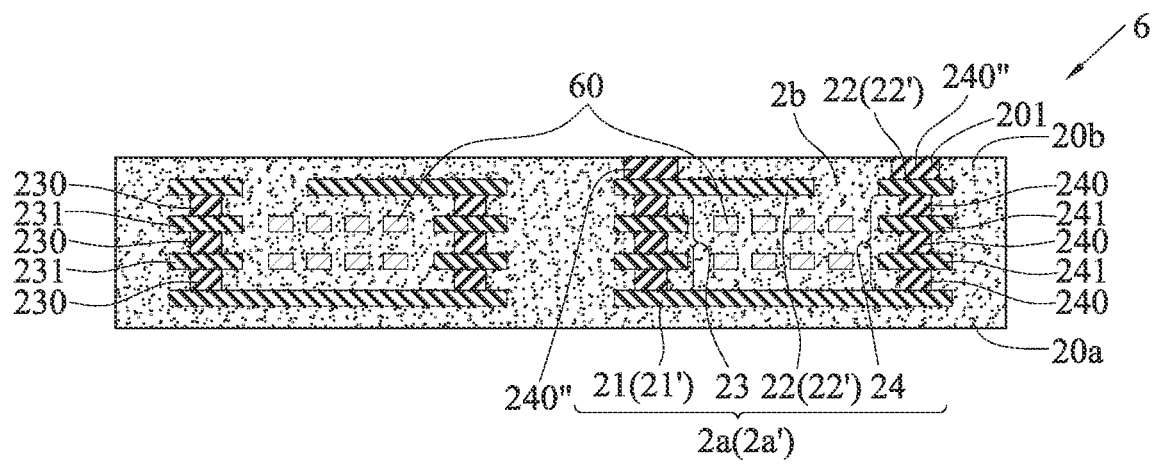
Figures 2, 6A:
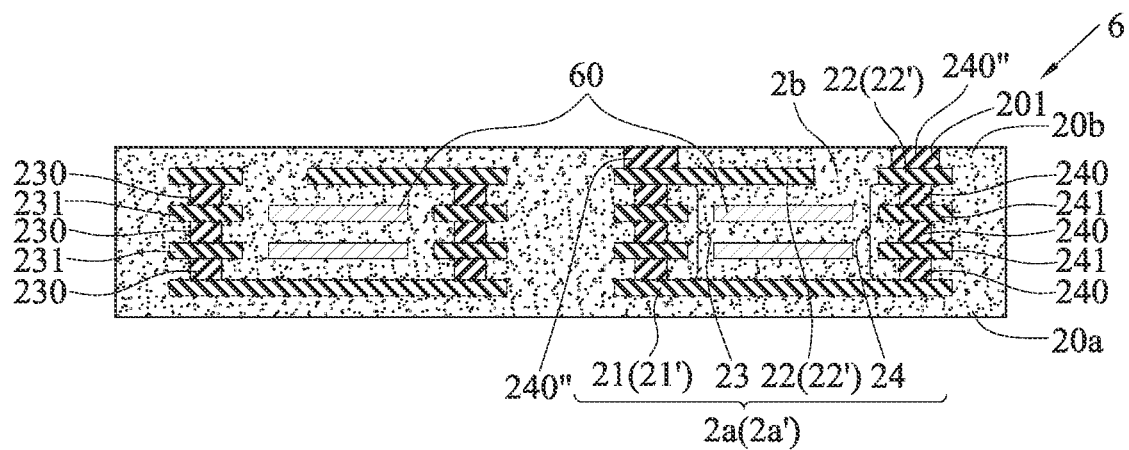

FIGS. 6A-1 and 6A-2 are schematic cross-sectional views of an inductor structure 6 according to another embodiment of the present disclosure.

Referring to FIGS. 6A-1 and 6A-2, based on the inductor structure 2 of FIG. 3A-1, the inductor structure 6 has at least a magnetic conducting metal 60 formed in the insulating body 2b by patterned electroplating.

In an embodiment, the magnetic conducting metal 60 has a ring shape, which is disposed around the first conductive post 23 on the first end 21a and the second conductive post 24 on the third end 23a so as to allow the first conductive post 23 on the first end 21a and the second conductive post 24 on the third end 23a to be positioned within the ring of the magnetic conducting metal 60. For example, the magnetic conducting metal 60 is arranged corresponding to the connecting pads 231, 241 so as to be positioned in the same layer as the connecting pads 231, 241. For example, eight rings of magnetic conducting metal 60 are shown in FIG. 6A-1 and two rings of magnetic conducting metal 60 are shown in FIG. 6A-2. In other embodiments, the magnetic conducting metal 60 and the connecting pads 231, 241 can be positioned in different layers.

Further, the magnetic conducting metal 60 contains an alloy of nickel (Ni), zinc (Zn), manganese (Mn), iron (Fe), cobalt (Co) or other suitable material so as to facilitate the function of the inductor structure 6.

Figures 1, 6B:
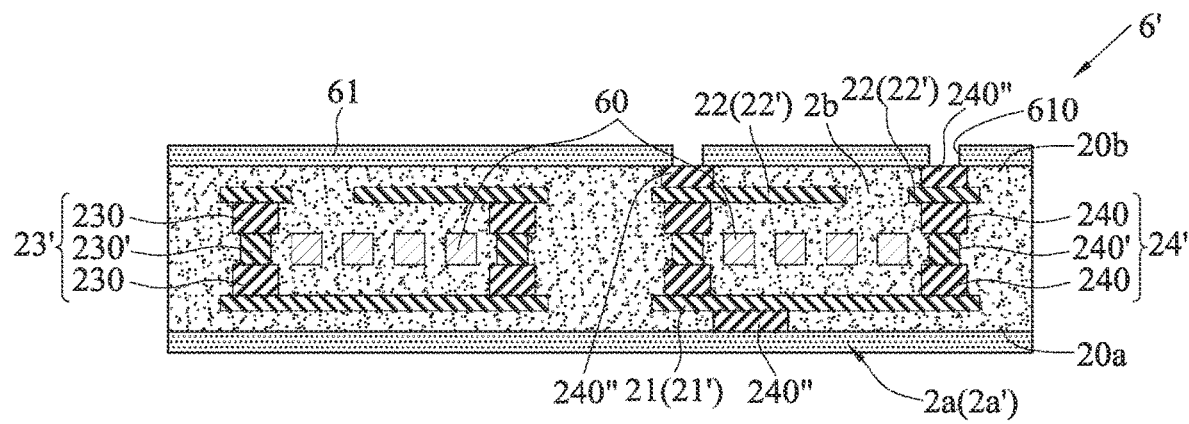
Figures 2, 6B:
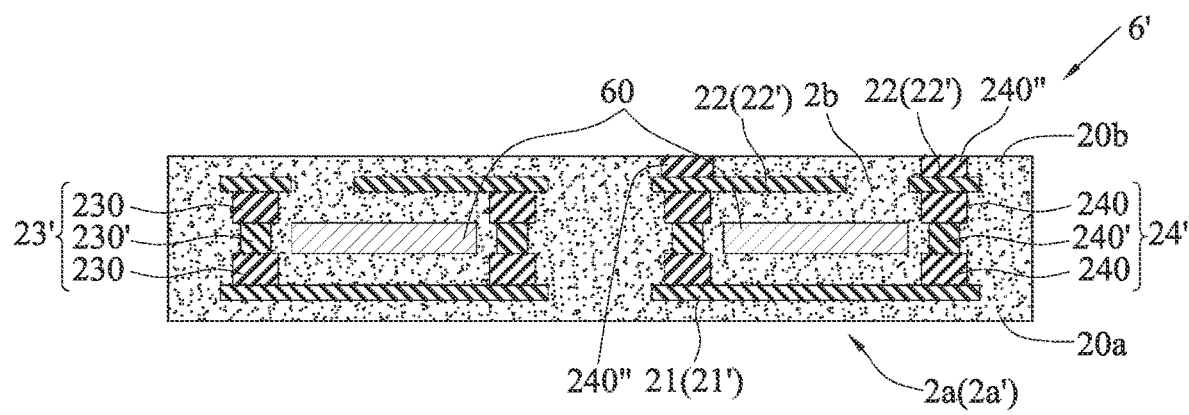

In other embodiments, the magnetic conducting metal 60 can be added to the inductor structure 2' of FIG. 3B-1 so as to form an inductor structure 6' of FIG. 6B-1 or FIG. 6B-2. For example, the magnetic conducting metal 60 is arranged corresponding to the first post bodies 230' and the second post bodies 240' having a smaller width, and positioned in the same layer as the first post bodies 230' and the second post bodies 240' having a smaller width. For example, four rings of magnetic conducting metal 60 are shown in FIG. 6B-1 and one ring of magnetic conducting metal 60 is shown in FIG. 6B-2.

Preferably, the magnetic conducting metal 60 is distributed in at least a layer, at least a fine dot, at least a fine block or at least a fine strip (e.g., the unit shape of the magnetic conducting metal 60 is of a fine multi-dot shape, multi-block shape, multi-ring shape, etc.). Since the magnetic conducting metal 60 has a better magnetic characteristic after being patterned, the Q-value of the inductor element is improved.

It should be understood that various kinds of magnetic conducting metals can be used and not limited to the above-described ring shape.

Therefore, in the inductor structure 6, 6' of the present disclosure, the magnetic conducting metal 60 is added so as to improve the inductance value of the inductor structure 6, 6'. Preferably, the magnetic conducting metal 60 is formed by electroplating two or three elements so as to obtain various shapes and distributions and preferred dimensional precision and hence obtain high inductor quality and precision.

Therefore, since the first conductive posts correspond in profile to the first ends of the first conductive sheets, the present disclosure greatly increases the number of ring-shaped winding loops of the inductor structure. Further, since the first conductive posts and the second conductive posts formed by stacking multi-layers of post bodies have an increased height and surface area, the cross-sectional area of the loops of the inductor structure is greatly increased. As such, the inductance value of the inductor structure is effectively improved.

Further, since the first conductive posts and the second conductive posts can have various non-cylindrical shapes according to needs, the area of copper in the first conductive posts and the second conductive posts for electrical conduction is greatly increased and hence the resistance of the first conductive posts and the second conductive posts becomes smaller, thus improving the electrical conduction efficiency, enhancing the thermal conductivity and improving the overall performance of end inductor products.

Furthermore, by electroplating the magnetic conducting metal, the inductor structure obtains preferred inductance value and performance.

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An inductor structure, comprising:
    an insulating body having opposite first and second sides;
    a plurality of first conductive sheets having a fan plate shape and embedded in the insulating body from the first side of the insulating body, wherein each of the first conductive sheets has opposite first and second ends, and a width of the first end is less than a width of the second end, wherein the plurality of first conductive sheets are arranged in a ring structure, the first ends of the first conductive sheets form an inner ring boundary of the ring structure, and the second ends of the first conductive sheets form an outer ring boundary of the ring structure relative to the inner ring boundary;
    a plurality of first conductive posts embedded in the insulating body and electrically connected to the first ends of the first conductive sheets, respectively, wherein a profile of an end surface of each of the first conductive posts corresponds to a profile of the first end of the first conductive sheet, and each of the first conductive posts comprises a plurality of first post bodies stacked on one another;
    a plurality of second conductive posts embedded in the insulating body and electrically connected to the second ends of the first conductive sheets, respectively, wherein a profile of an end surface of each of the second conductive posts corresponds to a profile of the second end of the first conductive sheet, and each of the second conductive posts comprises a plurality of second post bodies stacked on one another;
    a plurality of second conductive sheets having a curved plate shape and embedded in the insulating body from the second side of the insulating body, wherein each of the second conductive sheets has opposite third and fourth ends and is disposed on and across adjacent two of the first conductive sheets, a profile of the third end of the second conductive sheet corresponds to the profile of the first end of the first conductive sheet, the third end of the second conductive sheet is electrically connected to the first conductive post on the first end of one of the two adjacent first conductive sheets, a profile of the fourth end of the second conductive sheet corresponds to the profile of the second end of the first conductive sheet, and the fourth end of the second conductive sheet is electrically connected to the second conductive post on the second end of the other one of the two adjacent first conductive sheets, and
    wherein at least portions of adjacent two of the first conductive sheets are exposed from the first side of the insulating body or at least portions of adjacent two of the second conductive sheets are exposed from the second side of the insulating body for bonding with electrode pads.

2. The inductor structure of claim 1, wherein the first end of each of the first conductive sheets has an arc shape, and the end surface of the first conductive post disposed on the first end of the first conductive sheet has a fingertip shape.

3. The inductor structure of claim 1, wherein the first end of each of the first conductive sheets has a taper shape, and the end surface of the first conductive post disposed on the first end of the first conductive sheet has a triangular shape.

4. The inductor structure of claim 1, further comprising a connecting pad formed between the plurality of first post bodies stacked on one another or the plurality of second post bodies stacked on one another or both.

5. The inductor structure of claim 1, wherein widths of the plurality of first post bodies stacked on one another are different or widths of the plurality of second post bodies stacked on one another are different or the widths of both of the first post bodies and the second post bodies are different.

6. The inductor structure of claim 1, further comprising at least one magnetic conducting metal formed in the insulating body by electroplating, wherein the magnetic conducting metal comprises nickel, zinc, manganese, iron, cobalt, or a combination thereof.

7. The inductor structure of claim 6, wherein the magnetic conducting metal is disposed around the first conductive post on the first end and the second conductive post on the third end to allow the first conductive post on the first end and the second conductive post on the third end to be positioned within a ring of the magnetic conducting metal.

8. The inductor structure of claim 6, wherein the magnetic conducting metal is distributed in at least a layer, at least a fine dot, at least a fine block, or at least a fine strip.

9. The inductor structure of claim 1, wherein the insulating body comprises multi-layers of insulating material, and at least one layer of the multi-layers of the insulating material comprises a magnetic conducting material, wherein the magnetic conducting material comprises iron-nickel-molybdenum alloy powder, iron-silicon-aluminum alloy powder, or iron-nickel alloy powder in combination with a resin material.

10. An electronic package, comprising:
a packaging carrier having a circuit structure;
the inductor structure of claim 1 formed in the packaging carrier and electrically connected to the circuit structure; and
at least one electronic element disposed on one side of the packaging carrier and electrically connected to the circuit structure and the inductor structure.

11. The electronic package of claim 10, further comprising an encapsulant encapsulating the electronic element.

12. A method for fabricating an inductor structure using a coreless fabrication technique of an integrated circuit carrier, the method comprising:
forming a plurality of first conductive sheets on a carrier via a patterning process, wherein each of the first conductive sheets has opposite first and second ends, a width of the first end is less than a width of the second end, and each of the first conductive sheets has a fan plate shape, wherein the plurality of first conductive sheets are arranged in a ring structure, the first ends of the first conductive sheets form an inner ring boundary of the ring structure, and the second ends of the first conductive sheets form an outer ring boundary of the ring structure relative to the inner ring boundary;
forming a first conductive post on the first end of each of the first conductive sheets via the patterning process, and forming a second conductive post on the second end of each of the first conductive sheets via the patterning process, wherein a profile of an end surface of the first conductive post corresponds to a profile of the first end of the first conductive sheet, a profile of an end surface of the second conductive post corresponds to a profile of the second end of the first conductive sheet, the first conductive post comprises a plurality of first post bodies stacked on one another, and the second conductive post comprises a plurality of second post bodies stacked on one another;
forming an insulating material on the carrier to encapsulate the plurality of first conductive sheets, the first conductive posts and the second conductive posts, wherein portions of the first conductive posts and portions of the second conductive posts are exposed from the insulating material, the insulating body comprises a magnetic conducting material, and a dielectric material is formed on each of the magnetic conducting material for a circuit electroplating process;
forming a plurality of second conductive sheets on the dielectric material on the insulating material via a patterning process, wherein each of the second conductive sheets has opposite third and fourth ends and is disposed on and across adjacent two of the first conductive sheets, a profile of the third end of the second conductive sheet corresponds to the profile of the first end of the first conductive sheet, the third end of the second conductive sheet is electrically connected to the first conductive post on the first end of one of the two adjacent first conductive sheets, a profile of the fourth end of the second conductive sheet corresponds to the profile of the second end of the first conductive sheet, and the fourth end of the second conductive sheet is electrically connected to the second conductive post on the second end of the other one of the two adjacent first conductive sheets;
forming an insulating layer on the insulating material and the plurality of second conductive sheets to encapsulate the plurality of second conductive sheets;
removing the carrier to expose the insulating material and the plurality of first conductive sheets; and
forming another insulating layer on the insulating material and the plurality of first conductive sheets to encapsulate the first conductive sheets, wherein the insulating layers and the insulating material form an insulating body having opposite first and second sides,
wherein at least portions of adjacent two of the first conductive sheets are exposed from the first side of the insulating body or at least portions of adjacent two of the second conductive sheets are exposed from the second side of the insulating body for bonding with electrode pads.

13. The method of claim 12, wherein the first end of each of the first conductive sheets has an arc shape, and the end surface of the first conductive post disposed on the first end of the first conductive sheet has a fingertip shape.

14. The method of claim 12, wherein the first end of each of the first conductive sheets has a taper shape, and the end surface of the first conductive post disposed on the first end of the first conductive sheet has a triangular shape.

15. The method of claim 12, further comprising forming a connecting pad between the plurality of first post bodies stacked on one another or the plurality of second post bodies stacked on one another or both.

16. The method of claim 12, wherein widths of the plurality of first post bodies stacked on one another are different or widths of the plurality of second post bodies stacked on one another are different or the widths of both of the first post bodies and the second post bodies are different.

17. The method of claim 12, further comprising patterned electroplating at least one magnetic conducting metal in the insulating body.

18. The method of claim 12, wherein the conductive posts and the insulating material are fabricated in a layerwise build-up manner or in a single build-up manner by using the coreless fabrication technique of the integrated circuit carrier.

19. A method for fabricating a packaging carrier, comprising concurrently fabricating a circuit structure and at least the inductor structure of claim 1.

20. A method for fabricating an electronic package, comprising:
- providing a packaging carrier having a circuit structure;
- forming the inductor structure of claim 1 in the packaging carrier; and
- disposing at least one electronic element on one side of the packaging carrier, wherein the electronic element is electrically connected to the circuit structure and the inductor structure.

* * * * *